United States Patent [19]

Ebata et al.

[11] Patent Number: 4,707,416

[45] Date of Patent: Nov. 17, 1987

[54] NON-OXIDE CERAMICS-METAL COMPOSITE MATERIAL

[75] Inventors: Yoshihiro Ebata, Kawanishi; Ryozo Hayami, Takarazuka; Nobuyuki Tamari, Ikeda; Yasuo Toibana, Osaka; Makoto Kinoshita, Ikeda, all of Japan

[73] Assignee: Agency of Industrial Science and Technology, Tokyo, Japan

[21] Appl. No.: 723,028

[22] Filed: Apr. 15, 1985

[30] Foreign Application Priority Data

Jul. 7, 1984 [JP] Japan .................................. 59-141192

[51] Int. Cl.⁴ ....................... B32B 15/04; B32B 15/20; B32B 15/00; B21D 39/00
[52] U.S. Cl. .................................. 428/627; 428/621; 428/622; 428/674; 428/676; 428/679
[58] Field of Search ............... 428/450, 469, 698, 212, 428/622, 627, 628, 629, 621, 674, 675, 676, 678, 679, 632, 636

[56] References Cited

U.S. PATENT DOCUMENTS

| 3,826,629 | 7/1974 | Pryor et al. | 428/623 |
|---|---|---|---|
| 4,025,997 | 5/1977 | Gernitis et al. | 428/621 |
| 4,338,380 | 7/1982 | Erickson et al. | 428/594 |
| 4,499,152 | 2/1985 | Green et al. | 428/450 |
| 4,521,476 | 6/1985 | Asai et al. | 428/699 |
| 4,563,383 | 1/1986 | Kuneman et al. | 478/699 |

*Primary Examiner*—Norman Morgenstern
*Assistant Examiner*—Margaret Burke
*Attorney, Agent, or Firm*—Armstrong, Nikaido, Marmelstein & Kubovcik

[57] ABSTRACT

A composite material composed of a non-oxide type ceramic and iron or an alloy thereof is disclosed, wherein the non-oxide type ceramic is formed with a copper metallized surface and bonded to the iron or alloy thereof with an intermediate layer of Invar steel, Kovar or copper disposed between the copper metallized surface and the iron or alloy thereof.

4 Claims, No Drawings

NON-OXIDE CERAMICS-METAL COMPOSITE MATERIAL

BACKGROUND

This invention relates to a novel composite material composed of non-oxide ceramics and metal.

Ceramics, especially of the non-oxide type, have various desirable properties such as high heat resistance, wear resistance and chemical resistance. Ceramics of the non-oxide type, however, have a number of drawbacks as being brittle and low in impact strength, therefore for use as a structural material, it is usual to use a composite material composed of ceramics and a metal instead of using ceramics alone.

Various kinds of such composite materials have hitherto been developed. They include a composite material composed of non-oxide type ceramics and iron or an iron alloy. Although a composite material containing iron or an alloy thereof is expected to be useful for a wide range of application, no such material of satisfactory properties has so far been obtained. In order to manufacture such composite material, it has hitherto been usual to bond non-oxide type ceramics directly to iron or an alloy thereof or to dispose an intermediate layer by which the ceramic and iron components are bonded to each other. Iron or an alloy thereof, however, has a coefficient of thermal expansion which greatly differs from that of ceramics. If they are bonded to each other directly, they are easily separated from each other or broken when exposed to a thermal shock. This problem has been solved by the provision of an intermediate layer which may be formed from a soft metal, such as aluminum, or a foamed metal, and which undergoes elastic or plastic deformation to mitigate any strain of thermal expansion. A composite material including such an intermediate layer has an improved thermal shock resistance, but an extremely low adhesive strength between ceramics and iron or an alloy thereof.

SUMMARY

It is a first object of this invention to provide a composite material which is composed of non-oxide type ceramics and iron or an alloy thereof, and which is excellent both in thermal shock resistance and in adhesive strength.

It is a second object of this invention to provide a composite material which is composed of non-oxide type ceramics and iron or an alloy thereof and includes at least one intermediate layer of a well-known alloy or metal, and which is easy to manufacture.

It is a third object of this invention to provide a composite material which is composed of non-oxide type ceramics and iron or an alloy thereof, and which is useful for making structural members.

DETAILED DESCRIPTION OF THE PREFERRED EMBODIMENTS

The composite material of this invention is essentially composed of non-oxide type ceramics having a copper metallized surface, an intermediate layer of Invar steel, Kovar or copper, and iron or an alloy thereof. Each of its components will hereinafter be described in detail.

There is no particular limitation to the non-oxide type ceramics which can be used for the purpose of this invention. It is possible to use, for example, silicon nitride ($Si_3N_4$), Sialon, which is a compound of Si, Al, O and N, silicon carbide (SiC) or aluminum nitride (AlN).

According to a salient feature of this invention, the ceramic has a copper metallized surface on the side facing a layer of iron or an alloy thereof. Although there is no particular limitation to the method for the copper metallization of the ceramics surface, it is preferable to use one of the methods invented by the present inventors and disclosed in Japanese patent application Kokai (=laying-open) publication Nos. 59-156981 and 59-207887 and Japanese patent application No. 58-131575.

Referring more specifically to a preferred method for copper metallization, a coating, which comprises a mixture of at least one copper salt selected from copper carbonate, copper sulfate, copper sulfide, copper oxide and copper chloride with $SiO_2$ or kaolin or both, is applied to the ceramics surface and fired at a temperature of 900° to 1300° C. in an oxidizing atmosphere. The fired coating then is subjected to reduction treatment. This method enables the formation of a very good copper metallized surface. All of the copper compounds, $SiO_2$ and kaolin are usually used in powder form. The coating composition usually contains 5 to 50% by weight of $SiO_2$ and/or kaolin. A metallized layer having an improved adhesive strength is formed if the coating contains 5 to 30% by weight of sodium fluoride. The coating may be used in powder form, or in the form of a paste prepared by employing, for example, a printing ink such as screen oil, or balsam.

An appropriate quantity of the coating composition is applied by sprinkling or coating to the ceramics surface to be metallized. The coating is fired at a temperature of 900° to 1300° C. for about five to 60 minutes in an oxidizing atmosphere composed of, for example, air or a mixture of air and nitrogen, whereby a film consisting mainly of copper oxide and adhering closely to the ceramics surface is formed. Then, the film is reduced to yield non-oxide type ceramics having a copper metallized surface. The reduction of the film can be carried out by a variety of methods including heating the film at a temperature of, say, 200° to 900° C. for about five to 90 minutes in a reducing atmosphere composed of, for example, hydrogen or carbon monoxide, heating the ceramics to a temperature of, say, 200° to 500° C. and immersing it in a reducing solvent, for example, an alcohol such as ethanol, methanol or propanol, benzine or formalin for about 10 to 60 seconds, or heating the ceramics to a temperature of, say, 50° to 60° C. and immersing it in an aqueous dimethylamineborane solution for about 10 to 60 seconds.

An intermediate layer may be bonded to the copper metallized surface of the ceramics directly, but if the metallized surface is plated with copper or nickel by a customary method, it can be bonded to the intermediate layer more easily and more strongly. According to an essential feature of this invention, the intermediate layer is formed from Invar steel (which is an alloy containing say, 35% by weight of iron and 65% by weight of nickel), Kovar (which is an alloy containing, say, 17% by weight of cobalt, 29% by weight of nickel and 54% by weight of iron), or copper. The intermediate layer is usually a plate of Invar steel, Kovar or copper, including one having a curved or spherical shape. The thickness of the intermediate layer is not particularly limited, but can be selected to suit the purpose for which the composite material to be eventually produced will be used. It is usually in the range of 0.1 to 10 mm.

The intermediate layer can be bonded to the metallized surface of the ceramics, and iron or an alloy thereof to the intermediate layer, by any customary method including silver brazing. There is no particular limitation to the order in which they are bonded to one another. Iron or an alloy thereof may be bonded to the intermediate layer after the intermediate layer has been bonded to the ceramics, or this order can be reversed. It is alternatively possible to bond them together simultaneously. The iron alloy may, for example, be an alloy of iron and copper or an alloy of iron and nickel.

The composite material of this invention comprises non-oxide type ceramics having a copper metallized surface, iron or an alloy thereof and an intermediate layer of Invar steel, Kovar or copper disposed between the metallized surface of the ceramics and iron or an alloy thereof, as hereinabove described. It is, therefore, a material which is excellent in the thermal shock resistance and adhesive strength. The use of Invar steel for the intermediate layer enables the production of a composite material of markedly improved thermal shock resistance for reasons which are not clear. When Kovar is used, the excellent thermal shock resistance of the material is presumably due to the fact that it is a substance having a coefficient of thermal expansion lying between that of the ceramics and that of iron or an alloy thereof. In the event copper is employed, it is presumably due to the excellent ductility of copper. The composite material of this invention is, therefore, very useful for a variety of structural applications.

The invention will now be described more specifically with reference to several examples thereof.

EXAMPLE 1

A paste was prepared by mixing 10 parts by weight of balsam with 100 parts by weight of mixed powder consisting of 90% by weight of copper sulfide powder and 10% by weight of kaolin powder. It was coated in the quantity of 0.2 g/cm² on the surface of each of several kinds of sintered products of different non-oxide type ceramics in the form of a flat square plate measuring 17 cm square by 10 mm thick. Each of these ceramic plates was heated at 1100° C. for 15 minutes in an electric furnace containing air. Then, it was discharged therefrom and subjected to 60 minutes of hydrogen reduction at 300° C. in a furnace containing a hydrogen atmosphere, whereby each ceramic plate obtained a copper metallized surface. The metallized surface was plated with nickel by a customary method to enable a smooth flow of a silver solder. A sheet of Invar steel having a thickness of 0.5 mm was disposed between the copper-metallized, nickel-plated surface and an iron plate. They were joined together by a silver solder by heating at 840° C. for 10 minutes to yield a composite material composed of non-oxide type ceramics having a copper metallized, nickel plated surface, an intermediate layer of Invar steel and iron.

The composite materials prepared above were tested by a shear-strength tester adapted to apply a load of 2 tons at a speed of 5 mm per minute. They were all found very high in adhesive strength, i.e., the strength with which the ceramics, intermediate layer and iron were bonded together. They were also subjected to a fast cooling test: They were heated to 500° C. and cooled in water immediately thereafter. None of them presented any problem in thermal shock resistance. The results of these tests are shown in TABLE 1.

TABLE 1

| Ceramics | Adhesive strength (kg/cm²) | Thermal shock resistance |
| --- | --- | --- |
| Silicon nitride | 380 | Normal |
| Silicon carbide | 275 | " |
| Sialon | 390 | " |
| Aluminum nitride | 405 | " |

EXAMPLE 2

Several composite materials were produced by repeating EXAMPLE 1, except that Kovar was used for the intermediate layer instead of Invar steel. The test results are shown in TABLE 2.

TABLE 2

| Ceramics | Adhesive strength (kg/cm²) | Thermal shock resistance |
| --- | --- | --- |
| Silicon nitride | 340 | Normal |
| Silicon carbide | 240 | " |
| Sialon | 360 | " |
| Aluminum nitride | 392 | " |

EXAMPLE 3

Several composite materials were produced by repeating EXAMPLE 1, except that copper was used for the intermediate layer instead of Invar steel. The test results are shown in TABLE 3.

TABLE 3

| Ceramics | Adhesive strength (kg/cm²) | Thermal shock resistance |
| --- | --- | --- |
| Silicon nitride | 350 | Normal |
| Silicon carbide | 267 | " |
| Sialon | 365 | " |
| Aluminum nitride | 390 | " |

We claim:

1. A non-oxide ceramics-metal composite material comprising:
   a layer of a non-oxide ceramic;
   a layer of metallized copper formed on one surface of said layer of non-oxide ceramic;
   an intermediate layer formed a material selected from the group consisting of an iron-nickel alloy consisting essentially of 35 percent by weight iron and about 65 percent by weight nickel, a cobalt-nickel-iron alloy consisting essentially of about 17 percent by weight cobalt, about 29 percent by weight nickel and about 54 percent by weight iron, and copper and bonded on one surface thereof to the free surface of said layer of metallized copper opposite the layer of non-oxide ceramic; and
   a layer of iron or an iron alloy bonded to the other surface of said intermediate layer opposite said layer of metallized copper.

2. A composite material as claimed in claim 1, wherein a plated layer of copper is formed on said free surface of the metallized copper layer, said intermediate layer being bonded to the free surface of said plated layer of copper.

3. A composite material as claimed in claim 1, wherein a plated layer of nickel is formed on said free surface of the metallized copper layer, said intermediate layer being bonded on the free surface of said plated layer of nickel.

4. A composite material as claimed in claim 1, wherein said intermediate layer has a thickness between 0.1 and 10 mm.

* * * * *